United States Patent
Ra et al.

(10) Patent No.: US 7,504,884 B2
(45) Date of Patent: Mar. 17, 2009

(54) AUTOMATIC GAIN CONTROL APPARATUS OF CABLE MODEM, AND LOCK-TIME ACQUISITION METHOD USING THE SAME

(75) Inventors: Sang-Jung Ra, Jeollanam-do (KR); O-Hyung Kwon, Daejon (KR); Soo-In Lee, Daejon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 29 days.

(21) Appl. No.: 11/506,910

(22) Filed: Aug. 21, 2006

(65) Prior Publication Data

US 2007/0139113 A1 Jun. 21, 2007

(30) Foreign Application Priority Data

Dec. 7, 2005 (KR) .............. 10-2005-0118962

(51) Int. Cl.
 *H03G 3/30* (2006.01)
(52) U.S. Cl. .................. 330/279; 330/254; 330/278
(58) Field of Classification Search ........... 330/129, 330/254, 278, 279; 455/127.2, 232.1, 234.1, 455/245.1
 See application file for complete search history.

(56) References Cited

U.S. PATENT DOCUMENTS

| 5,917,372 A * | 6/1999 | Kakura et al. ............ 330/129 |
| 6,903,611 B2 * | 6/2005 | Kao ........................ 330/279 |
| 6,930,553 B2 * | 8/2005 | Takahashi ................ 330/279 |
| 2005/0084039 A1 | 4/2005 | Kocic et al. ............. 375/319 |

FOREIGN PATENT DOCUMENTS

| JP | 05-199270 | 8/1993 |
| JP | 2005-229570 | 8/2005 |
| KR | 1020030000892 | 1/2003 |
| KR | 1020040024805 | 3/2004 |

* cited by examiner

*Primary Examiner*—Khanh V Nguyen
(74) *Attorney, Agent, or Firm*—Lowe Hauptman Ham & Berner, LLP

(57) ABSTRACT

Provided is an automatic gain control (AGC) apparatus of a cable modem. The apparatus includes: a gain controller for measuring a power level of digital input signals transmitted from outside, accumulating the measured values of the digital input signals for a predetermined period, acquiring an average size of the signals, and calculating an error value between the average signal size and a predetermined signal size; an amplitude control unit for receiving error values adjusted by the gain controller and controlling an amplitude of the signal; a low pass filter for receiving the signal outputted from the amplitude control unit and performing low pass filtering on the signal; and a signal size control unit for receiving the signal obtained from filtering of the low pass filter and controlling the signal size.

8 Claims, 3 Drawing Sheets

AUTOMATIC GAIN CONTROL APPARATUS OF CABLE MODEM, AND LOCK-TIME ACQUISITION METHOD USING THE SAME

FIELD OF THE INVENTION

The present invention relates to an automatic gain control (AGC) apparatus of a cable modem, and a lock-time acquisition method using the same; and, more particularly, to an automatic gain control apparatus of a cable modem, and a lock-time acquisition method for acquiring a lock-time, which is a point when a signal level starts to be maintained uniformly by the control of the an automatic gain control apparatus.

DESCRIPTION OF RELATED ART

Since every inputted signal is calibrated to maintain a regular signal level in a conventional method, a large memory is required to store information on each calibration. A conventional automatic gain control method is performed as shown in FIG. 1.

FIG. 1 is a flowchart describing a conventional automatic gain control method.

A $1^{st}$ gain control block sets up a reference power level for a receiving high frequency signal and an error range, and initializes gain of a numerically controlled oscillator and attenuation of a high frequency signal at step S201.

Power level of signals I and Q transmitted through first and second mixers, and first and second low pass filters are measured at step S202. An error between the reference power level and the measured power level is calculated at step S203.

An average error value is acquired by sampling consecutive signals and accumulating the calculated error values at step S204. It is checked at step S205 whether the average error value converges into an error range.

When it turns out that the average error value converges into the error range, the gain of the numerically controlled oscillator is maintained at step S206 and the logic flow goes back to the step S202 to measure the power level of the transmitted signals I and Q.

When the average error value does not converge into the error range, it is checked at step S207 whether the power level of the receiving signal is low.

When it turns out that the power level of the reception signal is low, attenuation of the reception high frequency signal is decreased and the gain of the numerically controlled oscillator is increased at step S208. Then the logic flow goes to the step S202 to measure the power level of the receiving signals I and Q.

When the gain of the numerically controlled oscillator is increased, an output efficiency of the low pass filter increases. Whether the reception power is under a predetermined level is determined based on a set value of the error range. When a user sets up the error range and the reception power is out of the reference power, an automatic gain control (AGC) range and the error range, it is determined that the reception power is under the predetermined level.

When the power level of the reception signal is over the predetermined reference level based on the accumulated average error value of the power value of the measured reception signal, the gain of the numerically controlled oscillator (NCO) is initialized and the attenuation of the high frequency signal is increased based on a table for the attenuation rate at step S209. Subsequently, the logic flow goes to the step S202 to measure the power level of the receiving signals I and Q.

When the reception power of the receiving high frequency signal is low to maintain the power level of the receiving signal at a uniform level, the power level of the receiving signal can be maintained. Accordingly, the output efficiency of the low pass filter can be increased by compensating for the gain of the receiving signal in demodulation of the signal transformed into a digital signal.

It can be prevented that the error attenuating a normal signal due to the power of the signal increased by momentary noise is generated by using an accumulated average error rate between the receiving power and the reference power in the sample of the consecutive regular receiving signal in analog signal gain control.

However, since every inputted signal is calibrated to maintain a regular signal level, there is a problem that a large memory is required to store information on each calibration.

SUMMARY OF THE INVENTION

It is, therefore, an object of the present invention to provide an automatic gain control apparatus of a cable modem, and a lock-time acquisition method using the same to acquire a lock-time by distributing error values between a size of a signal transmitted from the outside and a size of a reference signal when the error value exists in a lock threshold, transmitting a lock index and controlling a level of a signal instead of calibrating entire signals.

Other objects and advantages of the invention will be understood by the following description and become more apparent from the embodiments in accordance with the present invention, which are set forth hereinafter. It will be also apparent that objects and advantages of the invention can be embodied easily by the means defined in claims and combinations thereof.

In accordance with an aspect of the present invention, there is provided an automatic gain control (AGC) apparatus of a cable modem, the apparatus including: a gain controller for measuring a power level of digital input signals transmitted from outside, accumulating the measured values of the digital input signals for a predetermined period, acquiring an average size of the signals, and calculating an error value between the average signal size and a predetermined signal size; an amplitude control unit for receiving error values adjusted by the gain controller and controlling an amplitude of the signal; a low pass filter for receiving the signal outputted from the amplitude control unit and performing low pass filtering on the signal; and a signal size control unit for receiving the signal obtained from filtering of the low pass filter and controlling the signal size.

In accordance with another aspect of the present invention, there is provided a lock-time acquisition method of an automatic gain control (AGC) apparatus in a cable modem, the method including the steps of: a) setting up a reference signal size and a lock threshold, and initializing a loop filter, a low pass filter and gain of a gain control amplifier; b) measuring a size of a signal transmitted from outside and calculating an error between the signal size and the reference signal size; c) accumulating errors between the measured two signals for a predetermined window period to acquire an average error; d) comparing the accumulated average error value with the lock threshold; and e) when the average error value converges into the lock threshold, deallocating a lock-time.

BRIEF DESCRIPTION OF THE DRAWINGS

The above and other objects and features of the present invention will become apparent from the following descrip

DETAILED DESCRIPTION OF THE INVENTION

Other objects and advantages of the present invention will become apparent from the following description of the embodiments with reference to the accompanying drawings. Therefore, those skilled in the art that the present invention is included can embody the technological concept and scope of the invention easily. In addition, if it is considered that detailed description on a related art may obscure the points of the present invention, the detailed description will not be provided herein. The preferred embodiments of the present invention will be described in detail hereinafter with reference to the attached drawings.

Figure 1:
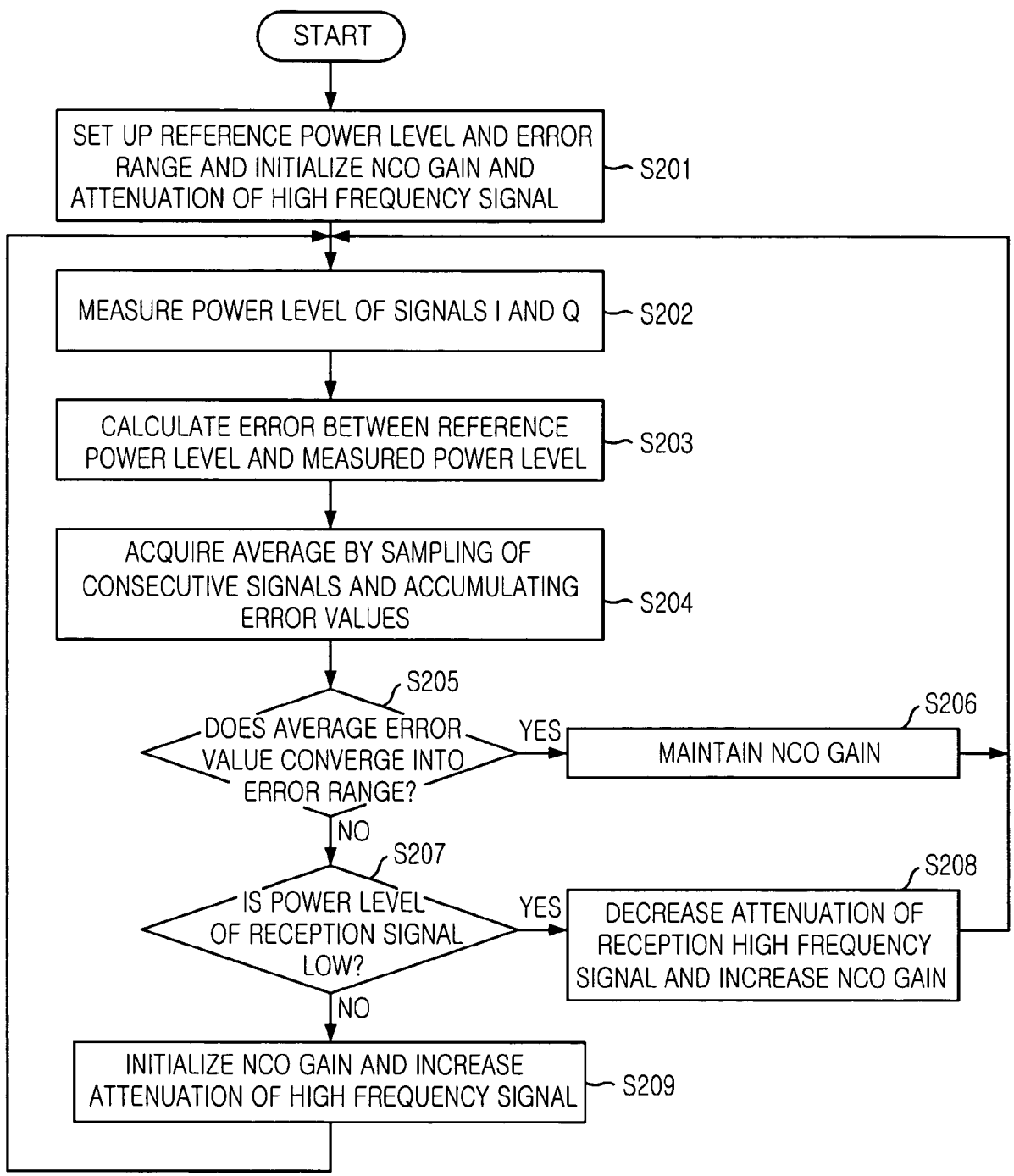
- FIG. 1 is a flowchart describing a conventional automatic gain control method.
Figure 2:
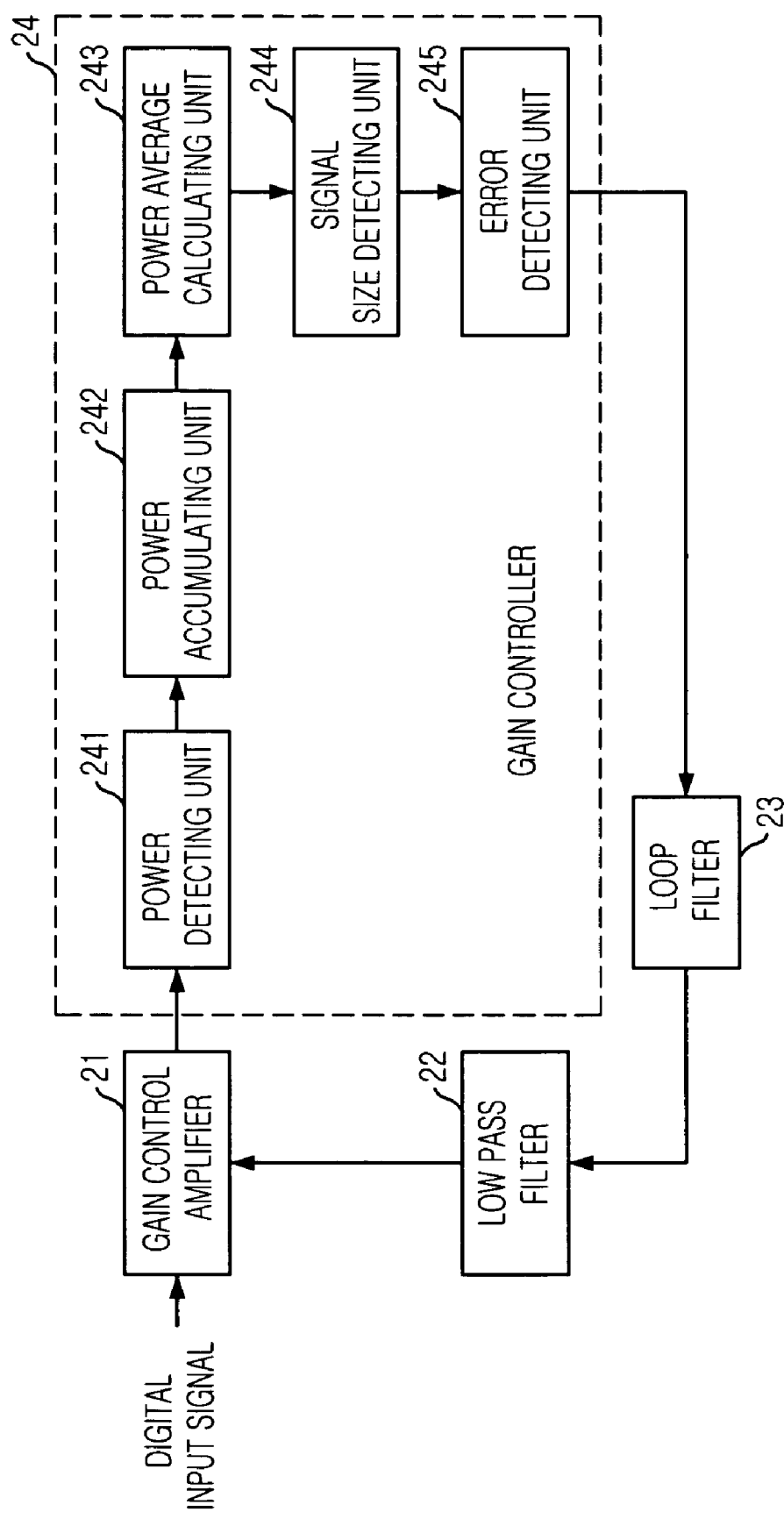
FIG. 2 is a block diagram showing an automatic gain control (AGC) apparatus of a cable modem in accordance with an embodiment of the present invention.

FIG. 2 is a block diagram showing an automatic gain control apparatus of a cable modem in accordance with an embodiment of the present invention.

The automatic gain control apparatus of the cable modem includes a gain controller 24, a loop filter 23, a low pass filter 22 and a gain control amplifier 21.

The gain controller 24 measures power of a digital input signal transmitted from outside, accumulates the measured values of digital input signal for a predetermined period, finds an average size of the signals and calculates an error value between the average size and the pre-determined size of the signal.

The loop filter 23 receives the error value controlled by the gain controller 24 and controls amplitude of the signal.

The low pass filter 22 receives an output signal obtained from the filtering of the loop filter 23 and performs low pass filtering on the output signal.

The gain control amplifier 21 receives the output signal obtained from the filtering of the low pass filter 22 and controls a signal size.

The gain controller 24 includes a power detecting unit 241, a power accumulating unit 242, a power average calculating unit 243, a signal size detecting unit 244 and an error detecting unit 245.

The power detecting unit 241 measures the power level of the reception signal, i.e., a digital input signal. The power accumulating unit 242 accumulates power values for a predetermined period to find an average value of the power detected through the power detecting unit 241. The power average calculating unit 243 finds an average power value of the signal based on the value accumulated in the power accumulating unit 242. The signal size detecting unit 244 finds a size of the signal based on result values of the power average calculating unit 243. The error detecting unit 245 calculates an error value between the average size of the inputted signal and the predetermined size of the signal.

The loop filter 23 includes an amplifier for loop gain of the signal, a delayer for comparison with a previous signal to control amplitude, and an adder for adding the previous signal to a present signal.

The low pass filter 22 includes two amplifiers for amplifying a gain to perform low pass filtering, a delayer and an adder.

The gain control amplifier 21 includes an amplifier for control of the signal size.

Referring to FIG. 2, the transmitted digital signal goes through a power detecting unit 241 to measure a power level in the gain controller 24. The signals that have gone through the power detecting unit 241 are accumulated and added for a predetermined period in the power accumulating unit 242, and the power average calculating unit 243 acquires an average power level of the signals that have gone through the power accumulating unit 242.

When the signal size detecting unit 244 acquires and outputs the average size of the signals based on the average power value, the error detecting unit 245 calculates and outputs an error value between the average signal size and the predetermined signal size.

The loop filter 23 receives an output value of the gain controller 24, controls and outputs amplitude of the signal. The low pass filter 22 performs low pass filtering by receiving the output of the loop filter 23 as input and outputs the result.

The gain control amplifier 201 controls and outputs the size of the signal by receiving the result of the low pass filtering as input to maintain the size of the signal uniformly.

Figure 3:
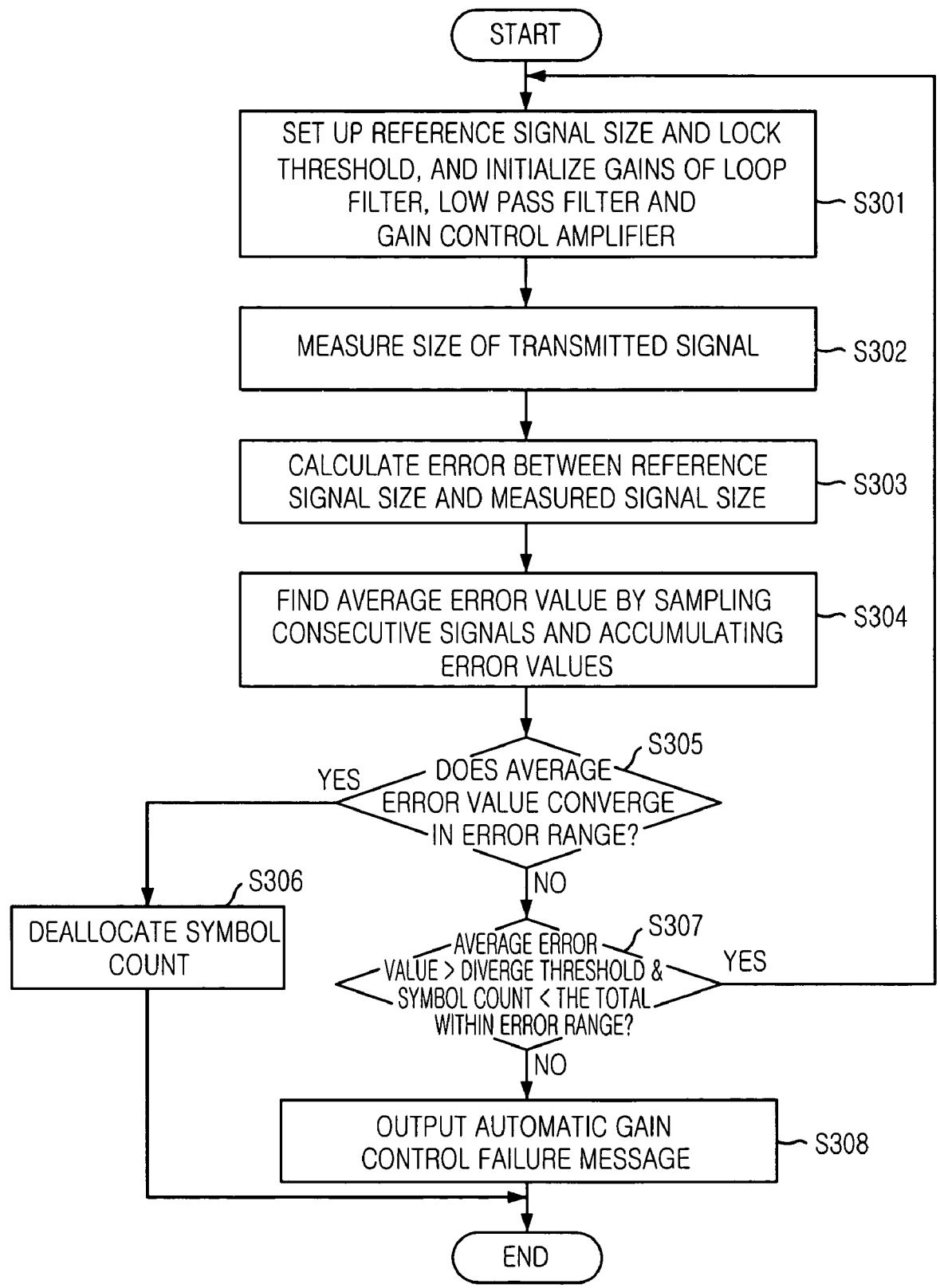
FIG. 3 is a flowchart describing a lock-time acquisition method using the automatic gain control apparatus in accordance with an embodiment of the present invention.

FIG. 3 is a flowchart describing a lock-time acquisition method using the automatic gain control apparatus in accordance with an embodiment of the present invention.

A reference signal size and a lock threshold are set up in operation of the automatic gain control apparatus, and gains of a loop filter, a low pass filter and a gain control amplifier are initialized at step S301.

A size of the signal transmitted through the gain control means is measured at step S302 and an error between the size of the signal and a predetermined size of a reference signal is calculated at step S303.

The measured error values are accumulated by sampling consecutive signals for a predetermined window period and acquiring the average of the error values at step S304. It is checked whether the average error value converges into the lock threshold at step S305.

When the average error value converges into the lock threshold, the lock signal is set up to be "0" and the number of present symbols is deallocated at step S306.

When the average error value does not converge into the lock threshold, it is checked whether a symbol count exists within the total number of symbols by comparing the average error value with diverge threshold at step S307.

When the symbol count exists within the total number of symbols, the logic flow goes to the step S301 and the procedure is repeated from the beginning after reset of the entire signals. When the symbol count is out of the total number of symbols, automatic gain control tracing is considered to be failed and a tracing failure message is outputted at step S308.

As described above, the present invention can easily restore a signal by deallocating the symbol count to acquire the lock-time of the automatic gain control apparatus in the cable modem when the size level of the reception signal is uniformly maintained in the cable modem.

When the size of the transmitted signal is out of the error range, the present invention has the signal converge in the error range. Accordingly, the automatic gain control can be performed with linked to the reception signal level.

As described in detail, the technology of the present invention can be realized as a program and stored in a computer-readable recording medium, such as CD-ROM, RAM, ROM, a floppy disk, a hard disk and a magneto-optical disk. Since the process can be easily implemented by those skilled in the art of the present invention, further description will not be provided herein.

The present application contains subject matter related to Korean patent application No. 2005-0118962, filed with the Korean Intellectual Property Office on Dec. 7, 2005, the entire contents of which are incorporated herein by reference.

While the present invention has been described with respect to certain preferred embodiments, it will be apparent to those skilled in the art that various changes and modifications may be made without departing from the scope of the invention as defined in the following claims.

What is claimed is:

1. An automatic gain control (AGC) apparatus of a cable modem, comprising:
   a gain control means for measuring a power level of a digital input signal transmitted from outside, accumulating the measured power level of the digital input signal for a predetermined period, determining an average signal size of the digital input signal, and calculating an error value between the average signal size and a predetermined signal size;
   a loop filter means for receiving the error value and for controlling an amplitude of the digital input signal;
   a low pass filtering means for receiving and performing low pass filtering on the signal outputted from the amplitude control means; and
   a signal size control means for receiving and controlling a size of the signal obtained from the low pass filtering means.

2. The apparatus as recited in claim 1, wherein the gain control means includes:
   a power detecting unit configured to measure a power level of the received digital input signal;
   a power accumulating unit configured to accumulate power levels detected in the power detecting unit;
   a power averaging unit configured to calculate an average power level of the received digital input signal based on the power levels accumulated in the power accumulating unit;
   a signal size detecting unit configured to determine the average signal size based on the average power level; and
   an error detecting unit configured to calculate an error value between the average signal size and the predetermined signal size.

3. The apparatus as recited in claim 1, wherein the amplitude control means includes an amplifier for loop gain of the digital input signal, a delayer for comparing the digital input signal with a previous digital input signal to control the amplitude, and an adder for adding the previous digital input signal to a present digital input signal.

4. The apparatus as recited in claim 1, wherein the low pass filtering means includes two amplifiers, a delayer, and an adder.

5. The apparatus as recited in claim 1, wherein the signal size control means includes an amplifier configured to control a size of the digital input signal.

6. A lock-time acquisition method of an automatic gain control (AGC) apparatus in a cable modem, comprising the steps of:
   a) setting up a reference signal size and a lock threshold, and initializing a gain of a loop filter, a low pass filter and a gain control amplifier;
   b) measuring a size of a signal received from outside and calculating an error value between the received signal size and the reference signal size;
   c) accumulating the error value for a predetermined window period and calculating an average error value based on the accumulated error value;
   d) comparing the calculated average error value with the lock threshold; and
   e) deallocating a lock-time when the average error value converges into the lock threshold.

7. The method as recited in claim 6, further comprising the steps of:
   f) when the average error value does not converge into the lock threshold, comparing the average error value with a predetermined diverge threshold and checking whether a symbol count value of the received signal exists within the total number of symbols; and
   g) when the symbol count value of the received signal exists in the total number of symbols of the received signal, repeating the steps of a) to f) after reset of the received signals and when the symbol count value of the received signal is out of the total number of symbols of the received signal, transmitting an automatic gain control failure message.

8. The method as recited in claim 6, wherein in the step e), a symbol count value of the received signal is deallocated at a lock-time to acquire the lock-time when the size of the received signal starts to be regularly maintained by automatic gain control.

* * * * *